United States Patent [19]
Akaike et al.

[11] Patent Number: 5,820,648
[45] Date of Patent: Oct. 13, 1998

[54] ANODIC BONDING PROCESS

[75] Inventors: Masatake Akaike, Atsugi; Takayuki Yagi, Machida, both of Japan

[73] Assignee: Canon Kabushiki Kaisha, Tokyo, Japan

[21] Appl. No.: 425,357

[22] Filed: Apr. 19, 1995

Related U.S. Application Data

[63] Continuation of Ser. No. 952,700, Sep. 28, 1992, abandoned.

[30] Foreign Application Priority Data

Sep. 30, 1991 [JP] Japan .................................. 3-276114

[51] Int. Cl.$^6$ .................................................. C05C 27/02
[52] U.S. Cl. ................................... 65/36; 65/40; 65/59.1; 65/59.4; 156/272.2; 156/273.9
[58] Field of Search ................................ 65/36, 42, 59.1, 65/40, 59.4, 59.3; 437/136, 147, 171, 196, 213, 215, 218, 223, 221; 228/193, 123.1, 197, 903; 156/272.2, 273.1, 273.9, 274.4, 272.8; 205/114, 124; 250/492.2

[56] References Cited

U.S. PATENT DOCUMENTS

| | | | |
|---|---|---|---|
| 3,397,278 | 8/1968 | Pomerantz | 156/273.9 |
| 3,417,459 | 12/1968 | Pomerantz et al. | 156/274.4 |
| 3,506,424 | 4/1970 | Pomerantz | 156/273.9 |
| 3,589,965 | 6/1971 | Wallis et al. | 156/272.2 |
| 3,783,218 | 1/1974 | Adams et al. | 219/10.53 |
| 3,951,707 | 4/1976 | Kurtz et al. | 156/273.9 |
| 4,294,602 | 10/1981 | Horne | 65/40 |
| 4,452,624 | 6/1984 | Wohltjen et al. | 65/40 |
| 4,457,972 | 7/1984 | Griffith et al. | 156/273.9 |
| 4,643,532 | 2/1987 | Kleiman | 65/36 |
| 5,160,560 | 11/1992 | Welkowsky et al. | 156/272.2 |

FOREIGN PATENT DOCUMENTS

| | | | |
|---|---|---|---|
| 2301170 | 8/1973 | Germany | 65/40 |
| 3436001 | 3/1986 | Germany . | |
| WOA9205575 | 4/1992 | WIPO . | |

OTHER PUBLICATIONS

Wallis et al., "Field Assisted Glass–Metal Sealing", Jour. of Applied Phys vol. 40, No. 10, pp. 3946–3949 (Sep. 1969).
"Current and Future Trends in Microjoining" by K.I. Johnson et al.; Welding and Metal Fabrication; vol. 59; No. 5, Jun. 1991, Haywards Heath GB, pp. 249–250.
"Chemistry of Glass" by S. Tutsuhashi; A Series of Monographs Modern Trends in Chemistry; 1972, Kohdansha, Japan; pp. 116–123.
Handbook of Glass Engineering; T. Moriya et al.; 1963 Asakura Shoten; Japan; pp. 16–19.
"Formation and Properties of Low–Melting Glasses in the Ternary Systems As–Tl–S, As–Tl–Se, and As–Se–S" by S. Flaschen et al.; Journal of The American Ceramic Society; vol. 43, No. 5; pp. 274–278.
"Field Assisted Glass–Metal Sealing" by G. Wallis et al.; Journal of Applied Physics; vol. 40, No. 10, Sep. 1969; pp. 3946–3949.

Primary Examiner—Steven P. Griffin
Attorney, Agent, or Firm—Fitzpatrick, Cella, Harper & Scinto

[57] ABSTRACT

A process for anodic bonding, in which Si substrate and glass substrate are contacting each other, a voltage is applied therebetween, and then light is irradiated on a contact portion thereof, whereby the Si substrate and the glass substrate are bonded at a lower temperature than transition temperature of the glass substrate.

14 Claims, 12 Drawing Sheets

ANODIC BONDING PROCESS

This application is a continuation-in-part of application Ser. No. 07/952,700 filed Sep. 28, 1992, now abandoned.

BACKGROUND OF THE INVENTION

1. Field of the Invention

The present invention relates to an anodic bonding process for connecting together glass and an electric conductor by applying a voltage therebetween, and an apparatus therefor.

2. Related Background Art

Conventionally, the anodic bonding between glass and silicon Si has been carried out by applying a voltage of about 300 V between the glass and Si, with Si as anode, while maintaining the temperature at about 400° C. near a transition point of glass, as described by George Wallis and Daniel I. Pomerantz in the *Journal of Applied Physics*, vol. 40, no. 10, Sep. 1969: (received 2 Jan. 1969 ).

However, in this conventional example, the bonding between the glass and Si is performed near a transition point of glass, so that thermal strain may possibly occur due to a difference between their thermal expansion coefficients when the temperature drops down to room temperature after the bonding at high temperature, resulting in a risk of peeling off. Therefore, it is required that the thermal expansion coefficients of glass and Si be equal in a wide range from room temperature to connection temperature.

SUMMARY OF THE INVENTION

A first object of the present invention is to provide an anodic bonding process which can avoid the above-mentioned drawback and which allows the secure connection without elevating the temperature to a transition point of glass.

DESCRIPTION OF THE PREFERRED EMBODIMENTS

Figure 1:
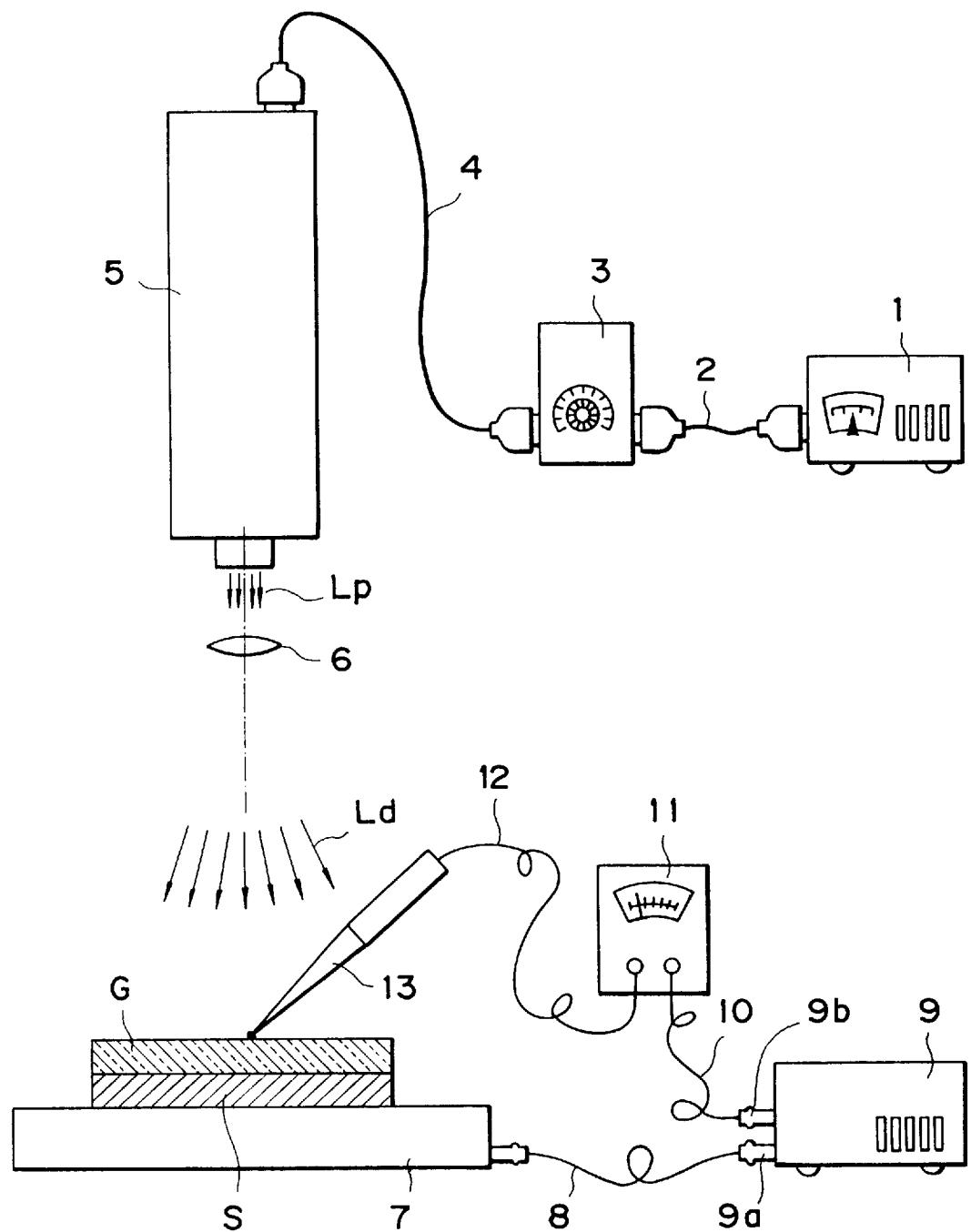
FIG. 1 is a constitutional view of an apparatus common to first and second embodiments.

The anodic bonding process in the preferred embodiments for anodic bonding made between glass and an electric conductor, is characterized by application of a voltage between the glass and the electric conductor, while irradiating a light beam from the glass side or the electric conductor side.

The anodic bonding process using light irradiation with the above-mentioned constitution can be carried out by applying a voltage between the electric conductor and the glass, while a light beam is irradiated so as to relax a network structure of the glass and to promote the diffusion of modifier ions in the glass, whereby the network structure of glass is relaxed at relatively low temperatures and modifier ions diffuse to the cathode side to cause a great electrostatic attractive force between the electric conductor and the glass, so that the solid phase bonding is achieved.

First, the principle of the anodic bonding process using the light irradiation will be described below.

When a glass substrate and a Si substrate are to be joined by the anodic bonding, the network structure is relaxed by cutting weak binding portions in the network structure of glass or exciting it with oscillation, or modifier ions in the glass are diffused by giving an energy exceeding an activation energy for the diffusion of modifier ions. In order to have a certain directivity in the diffusion of modifier ions, voltage is applied between the cathode, the glass substrate, and the anode, the Si substrate, to generate an electric field. Thus, modifier ions are attracted to the cathode side and oxygen ions are attracted to the anode side, so that a depletion layer is produced near the bonding interface on the glass side, whereby a great electrostatic attractive force is generated between the glass substrate and the Si substrate. The gap between both the substrates becomes atomic order due to this electrostatic attractive force, so that solid phase bonding is possible.

Since the network structure of glass is constructed of ionic bonds of various bond lengths, there are some portions where relaxation occurs with relatively small external energy due to small bonding energy. Therefore, the network structure can be relaxed in the atmosphere at relatively low temperatures, without elevating the temperature to a softening point of glass as conventionally practiced, by irradiating it with infrared light as well as heating by a heater if necessary. Alternatively, when modifier ions are diffused, it is necessary to supply an activation energy in a magnitude of about 15 to 30 kcal/mol for diffusion of modifier ions from the outside. This energy corresponds to ultraviolet rays (wavelength 0.2 to 0.45 μm) in terms of the light energy, therefore, can be supplied by ultraviolet radiation. The network structure can be also relaxed by irradiating ultraviolet light to cut weak binding portions in the network structure of glass. In this case, although activation energy for diffusion of modifier ions may need to be supplied in a certain amount with heating by a heater, the bonding is possible at relatively low temperatures. Further, for example, by irradiating ultraviolet light together with infrared light in a combination, the anodic bonding can be performed without heating.

This will be described in more detail.

In the anodic bonding between the glass substrate and the Si substrate, it is possible to attract modifier ions to the cathode side and oxygen ions to the anode side by applying a voltage between the anode of Si substrate and the cathode of glass substrate under the condition without heating by a heater, while irradiating light from the side of the glass or the Si substrate so as to relax the network structure of glass and to promote the diffusion of modifier ions in the glass. Since a steep gradient in the electric field occurs near a bonding interface of glass due to the movement of modifier ions, a great electrostatic attractive force is produced at the interface between the glass substrate and the Si substrate. Owing to this electrostatic attractive force, the interval between the glass substrate and the Si substrate is gradually made narrower, whereupon solid phase bonding is achieved when the distance becomes of atomic order.

Accordingly, in order to promote the diffusion of modifier ions with the electric field, as described above, it is necessary to relax the network structure of glass as much as possible by cutting ionic bonds at weak binding portions or exciting bonded ion with oscillation, or to supply energy for further activating the diffusion of modifier ions from the outside.

In general, the mobility of modifier ions in the glass, or the ionic conductivity, i.e., electric conductivity of glass $\delta$ can be expressed as follows:

$$\delta \alpha \exp(-\Delta Hdc/RT) \qquad (1)$$

where $\delta$ is an electric conductivity of glass, R is the gas constant, T is temperature, and $\Delta Hdc$ is activation energy for electric conduction.

Note that $\Delta Hdc$=(ionization energy)+(strain energy required to expand interstice of glass structure).

Accordingly, in the case of anodic bonding between the glass substrate and the Si substrate, in order to promote the movement of modifier ions in the glass under the condition without heating by a heater, i.e., at a bonding temperature T as low as possible, it is necessary to reduce a value of activation energy $\Delta Hdc$ for electric conduction.

Thus, in the present invention, the reduction of activation energy $\Delta Hdc$ for electric conduction of glass is attempted by supplying the light energy as ionic energy and energy to expand the glass structure. For this reason, it is necessary to apply a voltage corresponding to the activation energy $\Delta Hdc$ to both side faces of the glass substrate. Accordingly, the voltage is applied in a state in which the bonding surfaces of the glass substrate and the Si substrate are in close contact, whereby modifier ions in the glass substrate are diffused to the cathode side. As a result, an electrostatic attractive force contributing to the bonding is produced between the glass substrate and the Si substrate.

On the other hand, since absorption of light depends on the quality and thickness of material and transmittance of the light is reduced, it is desirable that the thicknesses of the glass substrate and the Si substrate be as thin as possible.

The present process is such that light is irradiated so as to relax the network structure as much as possible by cutting weak binding portions in the network structure of glass or exciting structural ions with oscillation, while applying an electric field between the glass substrate and the Si substrate. Therefore, the bonding between the glass substrate and the Si substrate is possible at lower temperatures, i.e., without heating by a heater. It will be appreciated that the bonding can be also made by the use of other electric conductors, instead of the Si substrate.

Figure 2:
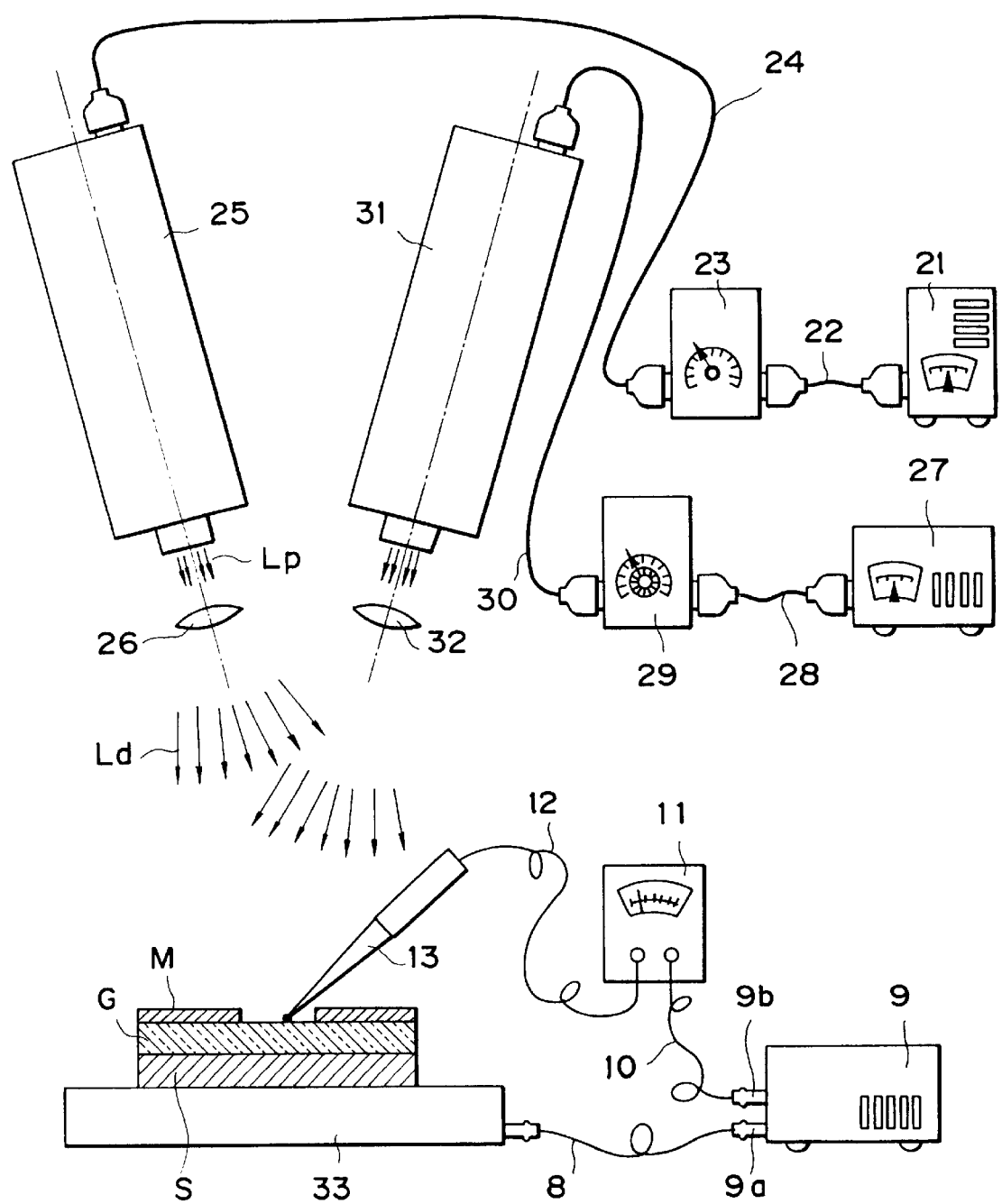
FIG. 2 is a constitutional view of an apparatus in a third embodiment.

Next, embodiments as illustrated in FIGS. 1 and 2 will be described in detail. FIG. 1 shows a constitutional view common to the use of an apparatus in first and second embodiments, in which an output of a laser power source 1 is connected via a connecting cord 2 to an input of a controller 3 for increasing or decreasing laser output, and an output of the controller 3 is connected via connecting cord 4 to an input of a laser oscillator 5. At an output optical axis of the laser oscillator 5, a lens 6 is disposed for transforming a parallel light Lp output from the laser oscillator 5 into a diffused light Lp. A glass plate G and an Si substrate S to be bonded are securely placed on a platen 7 equipped with a heater for heating, the glass plate G being on the top side. The platen 7 with heater is connected via a connecting cord 8 to a positive electrode 9a of a DC power source 9 for bonding. A negative electrode 9b of source 9 is connected via a connecting code 10 to a negative electrode of an ammeter 11. A positive electrode of the ammeter 11 is connected via a connecting cord 12 to a needle electrode 13 made of tungsten, wherein a top end of the needle electrode 13 is placed into contact with the surface of the glass plate G.

In the first embodiment, the laser oscillator 5 includes a carbon dioxide laser having a wavelength of 10.6 $\mu$m, and the lens 6 includes a convex lens made of Zn—Se. In this constitution, the laser power source 1 is turned on, and its output is regulated by the controller 3. Thereafter, infrared light is output from the laser oscillator 5. An output parallel light Lp is transformed into diffused light Ld by the lens 6, irradiating a plane of the glass plate G in contact with the Si substrate S. At the same time, the DC power source 9 is turned on to apply a negative voltage to the needle electrode 13 and a positive voltage to the platen 7 with heater. Thus, the negative voltage is applied to the glass plate G and the positive voltage to the Si substrate S.

In this way in an experiment, a voltage was applied to both faces of the glass plate G made of PYREX glass #7740 (PYREX is a trademark of Corning) 0.5 mm thick and 10 mm long and wide having a square shape and the Si substrate S, while infrared laser light having a strength of about 2 W/cm was irradiated. As is well known, PYREX glass is a heat resistant glass. An electric current of about 4 $\mu$A flowed in a state that the platen 7 with heater was heated up to a temperature of about 200° C. When the application of a voltage was continued for ten minutes while that current was maintained, the bonding between the glass plate G and the Si substrate S was achieved. However, when the laser light was not irradiated, the bonding was not enabled with the application of the same voltage.

In the second embodiment, an arrangement of the apparatus is the same as in FIG. 1, with the exception that the laser oscillator 5 includes a helium-cadmium laser having a wavelength of 0.32 to 0.44 $\mu$m, and the lens 6 includes a convex lens made of KDP. The laser power source 1 is turned on and adjusted by the controller 3. An ultraviolet light output from the laser oscillator 5 is diffused by the lens 6 and irradiated, while a negative voltage from the DC power source 9 is applied to the glass plate G, and a positive voltage to the Si substrate S.

As in the first embodiment, when ultraviolet laser light having a strength of about 2 W/cm$^2$ was irradiated on the glass plate G made of PYREX glass #7740 0.5 mm thick and 10 mm square and the Si substrate S, with the platen 7 with heater heated up to about 200° C., and a voltage capable of flowing an electric current of about 4 μA was applied for ten minutes. The bonding between the glass plate G and the Si substrate S was enabled. However, when the laser light was not irradiated, the bonding was impossible with the application of the same voltage. Note that an ultraviolet light source such as a memory lamp can be also used instead of the helium-cadmium laser, with the same effects.

FIG. 2 shows a constitutional view of an apparatus in third embodiment, in which an output of a carbon dioxide laser power source 21 is connected via a connecting cord 22 to input of a controller 23 for adjusting the laser output, and an output of the controller 23 is connected via a connecting cord 24 to input of a carbon dioxide laser oscillator 25. On an output optical axis from the carbon dioxide laser oscillator 25 is disposed a Zn—Se lens 26 for transforming a parallel light Lp into diffused light Ld. A glass plate G and a Si substrate S to be bonded are disposed below the lens. On the other hand, an output of a helium-cadmium laser power source 27 is connected via a connecting cord 28 to input of a controller 29 for adjusting the laser output, and an output of the controller 29 is connected via a connecting cord 30 to input of a helium-cadmium laser oscillator 31. On an output optical axis from the helium-cadmium laser oscillator 31 is disposed a KDP lens 32 for transforming a parallel light Lp to diffused light Ld. Below the lens, the glass plate G and the Si substrate S secured on a platen 33 without heater are disposed. The electrical connection for the glass plate G and the Si substrate S is the same as in the previous embodiment. Also, there is provided a mask M made of tungsten having an aperture on the glass plate G so as to pass the irradiated light only through the aperture.

In this constitution, the carbon dioxide laser power source 21 is turned on, and the laser output is adjusted by the controller 23, thereafter, infrared light is output from the carbon dioxide laser oscillator 25, and transformed into diffused light Ld by the Zn—Se lens 26 to irradiate the glass plate G. At the same time, the helium-cadmium laser power source 27 is turned on, and the laser output is adjusted by the controller 29. Thereafter, ultraviolet light is output from the helium-cadmium laser oscillator 31 and transformed into diffused light Ld by the KDP lens 32 to also irradiate the glass plate G. Further, at the same time, the DC power source 9 is turned on to apply a negative voltage via a needle electrode 13 to the glass plate G and a positive voltage via a platen 33 to the Si substrate S.

In this way, as in the first and second embodiments, infrared laser light of about 2W/cm$^2$ and ultraviolet laser light of about 2W/cm$^2$ were irradiated, while a voltage was applied to both end faces of the square glass plate G made of PYREX glass #7740 0.5 mm thick and 10 mm square and the Si substrate S, and a voltage capable of flowing an electric current of about 2 μA was applied for ten minutes, so that the bonding between the glass plate G and the Si substrate S was allowed beneath the aperture of mask M. At this time, no bonding was made on a portion not irradiated by the laser beam because the light was shielded by the mask.

In this way, by applying a voltage to the glass and the electric conductor while irradiating both ultraviolet light for relaxing the network structure of glass by cutting weak binding portions in the network structure and promoting the diffusion of modifier ions in the glass, and infrared light for relaxing the network structure by exciting ions of the network structure, the anodic bonding without heating becomes possible. In this case, a glass having modifier ion such as Na, Ca, Sr, Ba, Li, K, Rb, Cs, Fe, Be, Mg, Ni, Zn, Co, and Pb ions can obtain the same effects.

While in the first and second embodiments as previously described, laser radiation was applied over the entire surface of the glass plate G, it should be noted that only a partial surface thereof can be bonded by using a mask M equivalent to that of the third embodiment to limit irradiated area. Also, the heating temperature was about 200° C., but may be set at different temperatures in view of the difference between thermal expansion coefficients without causing any trouble.

Also, while in the third embodiment the heating is not done, the heating may be done to the degree not to obstruct the bonding due to the difference between thermal expansion coefficients, in order to improve reaction speed. A method for limiting the bonding portion may be realized by narrowing laser light flux to limit the irradiated area, instead of placing a mask M on the glass plate G. In the described embodiments, instead of using a PYREX #7740 glass as the glass plate G, a soda silicate glass, for example, can be used with the same excellent bonding to the Si substrate S.

As above described, according to the anodic bonding process using light irradiation in the above embodiments, a light is irradiated on a portion of the glass to be bonded with the electric conductor to lower the bonding temperature, whereby the bonding is relatively easily performed even with different thermal expansion coefficients, also when there is a device arranged on the glass or electric conductor, there is no adverse effect to device characteristics due to high temperature. Further, it is possible to bond only a necessary portion by limiting irradiated area with a light-shielding mask.

In the following, another embodiment will be described.

Figure 3:
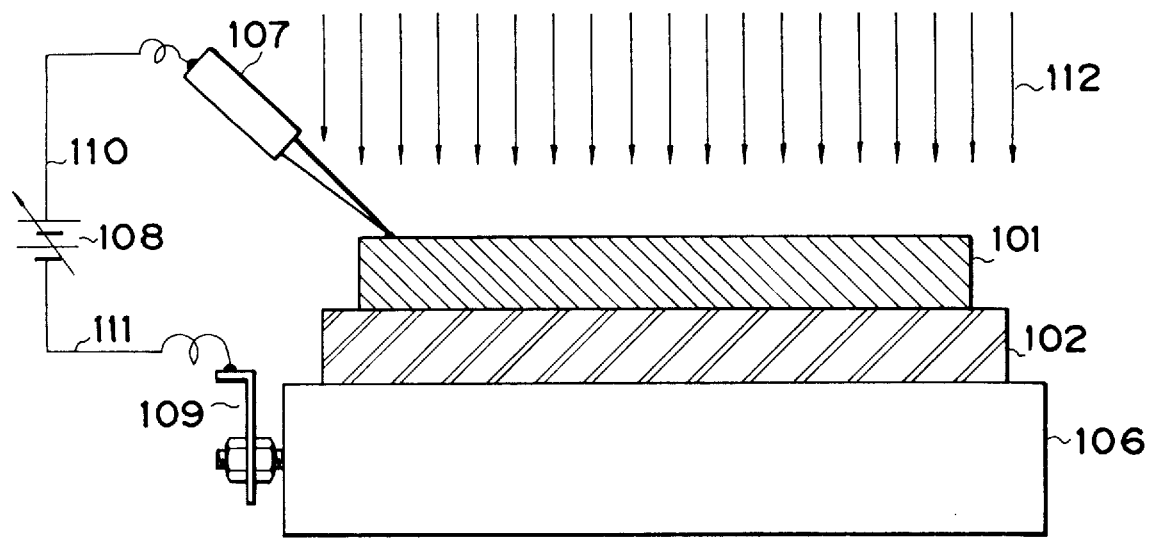
FIG. 3 is a cross-sectional view of the bonding between a Si substrate and a photosensitive glass in a fourth embodiment of the present invention.

FIG. 3 is a view for explaining a fourth embodiment of the present invention. FIG. 3 is a view best depicting the features of this embodiment, in which reference numeral 101 is a Si substrate to be bonded, 102 is a light sensitive glass substrate to be bonded with the Si substrate, 106 is an electrically conductive platen, 107 is a needle electrode electrically connected to the Si substrate 101, 108 is a power source for applying a voltage between the Si substrate 101 and the light sensitive glass substrate 102, 109 is an electrode for the platen 106, 110 is a lead wire for the electrical connection between the needle electrode 107 and the power source 108, 111 is a lead wire for the electrical connection between the power source 108 and the electrode 109 of the platen 106, and 112 is a carbon dioxide laser for irradiating the light sensitive glass substrate 102 including a portion serving as the bonding interface between the Si substrate 101 and the light sensitive substrate 102. The light sensitive glass is one whose property permanently or reversibly changes upon irradiation.

In the above constitution, the Si substrate 101 and the light sensitive glass 102 are placed on the platen 106 with their bonding planes face to face. Further, after the needle electrode 107 is brought into contact with the surface of the Si substrate 101 for electrical connection. The power source 108 is turned on to apply a voltage between the Si substrate 101 and the light sensitive glass substrate 102. Further, irradiation of a laser light 112 is continued from above of the Si substrate 101 while the voltage is being applied. In this embodiment, heating by a heater or the like is unnecessary. In the above process, the bonding between the Si substrate 101 and the light sensitive glass 102 was made. PEG glass is employed as the light sensitive glass (PEG is a trademark by HOYA Corporation). Bonding conditions in this embodiment are as follows.

Size of Si (100) substrate:
26 mm×38 mm×0.5 mm (thickness)
Size of light sensitive glass:
30 mm×42 mm×1 mm (thickness)
(PEG glass made by HOYA Corporation)
Applied voltage: 1.2 kV
Laser beam: Carbon dioxide laser ($\cong 5$ W/cm$^2$
Time: ten minutes per spot
Area per spot of laser beam: $\cong 1$ cm$^2$ After this bonding experiment, a bonded sample was cut with a disc cutter, but there was no peeling at the bonding interface. That is, it has been proven that this bonding process can be put to practical use.

Figure 4:
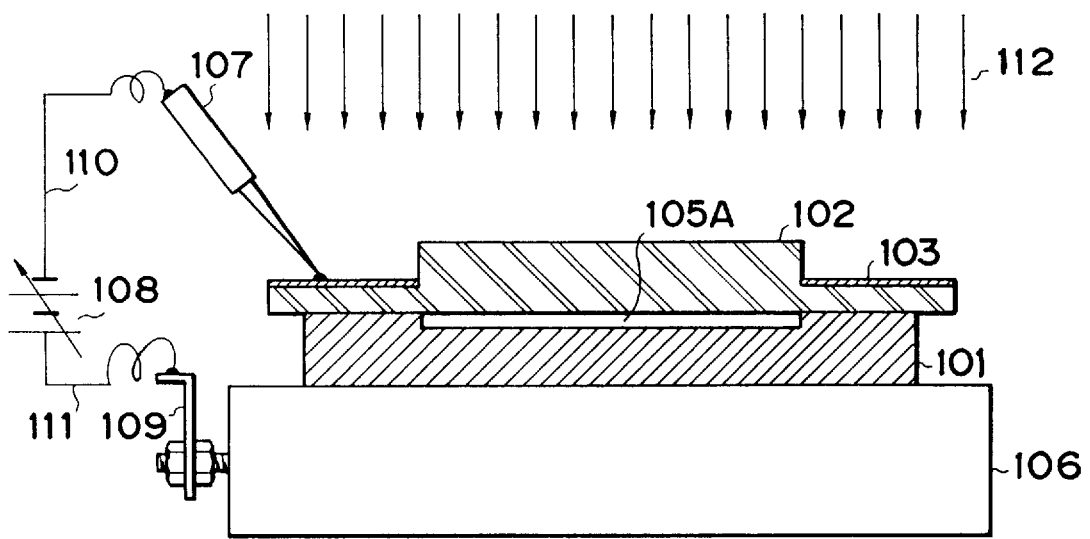
FIG. 4 is a cross-sectional view of the selective bonding between a Si substrate and a photosensitive glass in a fifth embodiment of the present invention.

FIG. 4 is a view for explaining a fifth embodiment of the present invention. FIG. 4 is a view best depicting the features of this embodiment, in which reference numeral 101 is a Si substrate for bonding, 102 is a light sensitive glass substrate for bonding with the Si substrate, 103 is a thin film electrode composed of Si thin film formed on a plane of the light sensitive glass substrate 102 opposite to and just above a bonding portion of the light sensitive glass substrate 102, 106 is an electrically conductive platen, 107 is a needle electrode electrically connecting to the thin film electrode 103, 108 is a power source for applying a voltage between the Si substrate 101 and the light sensitive glass substrate 102, 109 is an electrode for the platen 106, 110 is a lead wire for electrical connection between the needle electrode 107 and the power source 108, 111 is a lead wire for electrical connection between the power source 108 and the electrode 109 of platen, and 112 is an excimer laser beam for irradiating the light sensitive glass substrate 102 including a portion serving as the bonding interface between the Si substrate 101 and the light sensitive substrate 102. A KrF laser (wavelength of 246 mm) which was a rare gas halide laser was employed as the excimer laser light source.

In the above constitution, a voltage is applied through the needle electrode 107 and the platen 106 between the thin film electrode 103 and the Si substrate 101 by the power source 108, after the Si substrate 101 and the light sensitive glass 102 is close contact face to face as shown in FIG. 4. By the application of the voltage, the electric field is maximum near the bonding interface of the light sensitive glass 102 directly under the thin film electrode 103, i.e., near the bonding interface thinned at both end portions of the light sensitive glass 102 in FIG. 4. Accordingly, the bonding between the Si substrate 101 and the light sensitive substrate 102 can be easily performed only at this portion where the electric field is maximum. That is, partial selective bonding between the Si substrate 101 and the light sensitive glass substrate 102 is possible.

In this embodiment, a (100) plane was a surface of the Si substrate, and a groove 105A on the Si substrate 101 was formed by electric field anisotropic etching using a KOH solution. Etching for forming thinned end portions of the light sensitive glass substrate 102 was accomplished by irradiating an excimer laser light through a mask (for shielding a laser beam) having an opening only at a portion to be thinned, thereafter performing the heat treatment (430° C.×2 hr.), and etching in 10% hydrogen fluoride solution. Note that a plane of the light sensitive glass substrate 102 on the side of bonding is not etched, because of a resist film applied, during the etching for formation of thinned portion. After the etching for formation of thinned portion, the resist film was eluted by acetone. And after washing, the thin film electrode 103 made of Si was formed using the mask having an opening only at thinned end portions of the light sensitive glass substrate 102.

Bonding conditions in this embodiment are as follows.
Size of Si (100) substrate:
26 mm×38 mm×0.5 mm (thickness)
with size of groove 105A:
26 mm×18 mm×0.2 mm (depth of groove)
Size of light sensitive glass substrate:
30 mm×42 mm×1.0 mm (thickness)
(PEG glass made by HOYA Corporation)
with sheet thickness of thinned portion at both ends: 0.4 mm
Thickness of thin film electrode: 1000 Å
Applied voltage: 500 V
Laser beam: Excimer laser ( 1.5 W/cm$^2$)
Time: ten minutes per spot
Area per spot of laser beam: $\cong 0.5$ cm$^2$ After this bonding experiment, a bonded sample was cut with a disc cutter, but there was no peeling at the bonding interface. That is, it has been proven that this bonding method can be put to practical use.

Figure 5:
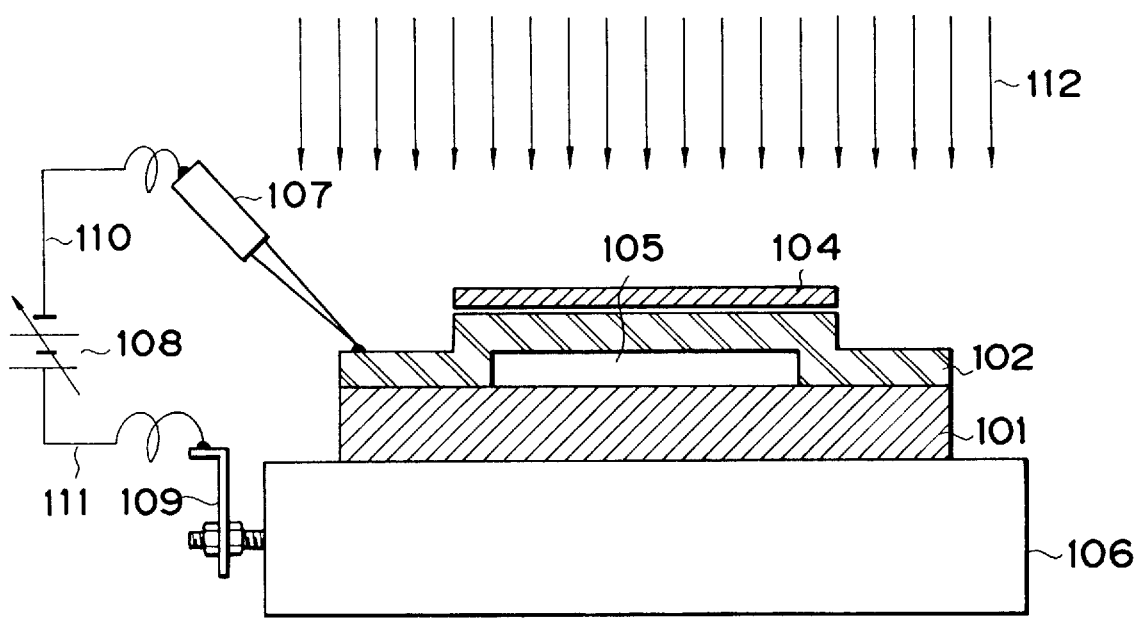
FIG. 5 is a cross-sectional view of the selective bonding between an Si substrate and a photosensitive glass in a sixth embodiment of the present invention.

FIG. 5 is a view for explaining a sixth embodiment of the present invention. FIG. 5 is a view best depicting the features of this embodiment, in which reference numeral 101 is a Si substrate for bonding, 102 is a light sensitive glass substrate for bonding with the Si substrate 101, 104 is a light shielding mask for shielding a laser beam so as to avoid the bonding of a laser shielded area, i.e., for the purpose of selective bonding, 105 is a groove provided on the light sensitive glass substrate 102, 106 is an electrically conductive platen, 107 is a needle electrode electrically connectable to a thinned portion at both ends of the light sensitive glass 102, 108 is a power source for applying a voltage between the Si substrate 101 and the light sensitive glass substrate 102, 109 is an electrode for the platen 106, 110 is a lead wire for electrical connection between the needle electrode 107 and the power source 108, 111 is a lead wire for electrical connection between the power source 108 and the electrode 109 of the platen 106, and 112 is a carbon dioxide laser beam for irradiating the light sensitive glass substrate 102 including a portion serving as the bonding interface between the Si substrate 101 and the light sensitive substrate 102.

In the above constitution, the light shielding mask 104 is placed just above the groove 105 of the light sensitive glass substrate 102, after the Si substrate 101 and the light sensitive glass substrate 102 have been closely contacted face to face as shown in FIG. 5. The needle electrode 107 is electrically connected to a plane opposite and just above a bonding plane of the light sensitive glass 102, and a voltage is applied between the light sensitive glass substrate 102 and the Si substrate 101 by the power source 108. By the application of the voltage, the electric field is maximum near the bonding interface in a thinned portion at both ends of the light sensitive glass. The light enters only the thinned portion at the both ends owing to the masking. Accordingly, the bonding between the Si substrate 101 and the light sensitive glass substrate 102 can be easily accomplished only at this portion where the electric field is maximum and the light enters. That is, partial selective bonding between the Si substrate 101 and the light sensitive glass substrate 102 is possible.

In this embodiment, a (100) plane was a surface of the Si substrate, and the formation of groove 105 on the light sensitive glass 102 and thinned portion at both ends thereof was performed in the same process as described in the fifth embodiment.

Bonding conditions in this embodiment are as follows.

Size of Si (100) substrate:
26 mm×38 mm×0.5 mm (thickness)
Size of light sensitive glass:
30 mm×42 mm×1.0 mm (thickness)
(PEG glass made by HOYA Corporation) with size of groove 105:
30 mm×22 mm×0.5 mm (depth) with sheet thickness of thinned portion at both ends: 0.4 mm
Applied voltage: 500 V
Laser beam: Carbon dioxide laser ($\cong 5$ W/cm$^2$)
Time: ten minutes per spot
Mask: Al plate
Area per spot of laser beam: $\cong 1$ cm$^2$ After this bonding experiment, a bonded sample was cut with a disc cutter, but there was no peeling at the bonding interface. That is, it has been proven that this bonding process can be put to practical use. Note that even if a YAG laser (4 W/cm$^2$) was used instead of a carbon dioxide laser, the bonding between the Si substrate 101 and the light sensitive glass substrate 102 was possible in the same way as with the carbon dioxide laser.

Note that when the mask 104 was formed of a polymeric resist film, Al film, Au film, or Pt film, the bonding strength equivalent to that as above mentioned could be obtained.

On the other hand, the same bonding of the materials, i.e., the bonding between the light sensitive glass and the Si substrate was performed under the following conditions, using a conventional anodic bonding. As a result, there occurred peeling at a bonding portion during decreasing the bonding temperature to room temperature, thus the bonding could not be made.

Figure 6:
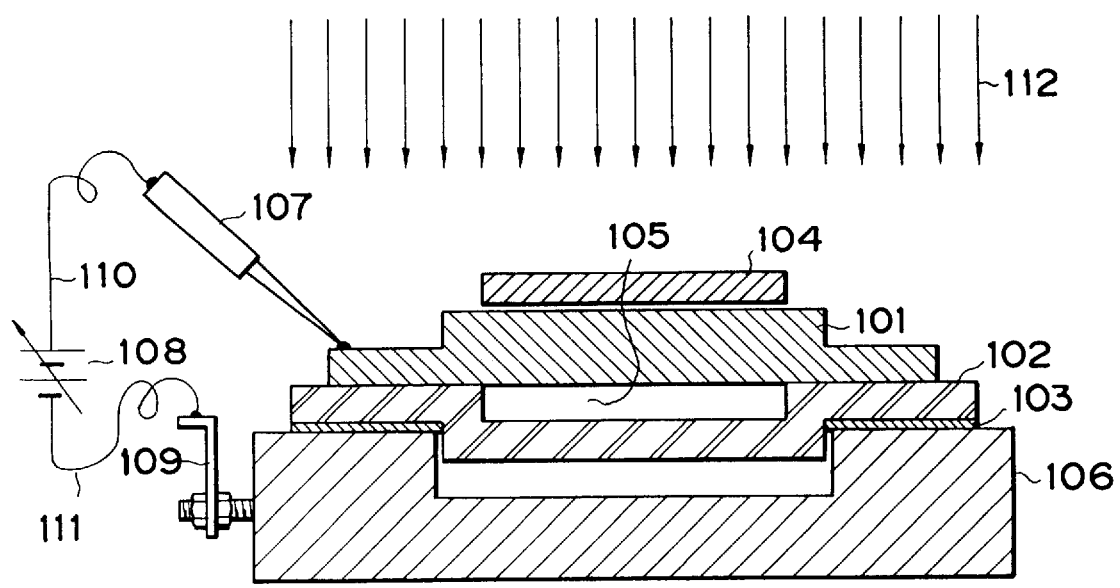
FIG. 6 is a cross-sectional view of the selective bonding between a Si substrate and a photosensitive glass in a seventh embodiment of the present invention.

Conditions for conventional anodic bonding experiment:
Bonding material: Light sensitive glass
(PEG glass made by HOYA Corporation)/Si(100)
Temperature: 350° C.
Applied voltage: 500 V
Bonding time: forty minutes FIG. 6 is a view for explaining a seventh embodiment of the present invention. FIG. 6 is a view best depicting the features of this embodiment, in which reference numeral 101 is a Si substrate for bonding, 102 is a light sensitive glass substrate for bonding with the Si substrate 101, 103 is a thin film electrode made of Si thin film formed on a surface of the light sensitive glass substrate opposite and just below a bonding portion of the light sensitive glass substrate 102, 104 is a light shielding mask for shielding a laser beam so as to avoid the bonding of a laser shielded area, i.e., for the purpose of selective bonding, 105 is a groove provided on the light sensitive glass substrate 102, 106 is an electrically conductive platen, 107 is a needle electrode electrically connecting to the Si substrate 101, 108 is a power source for applying a voltage between the Si substrate 101 and the light sensitive glass substrate 102, 109 is an electrode for the platen 106, 110 is a lead wire for electrical connection between the needle electrode 107 and the power source 108, 111 is a lead wire for electrical connection between the power source 108 and the electrode 109 of the platen 106, and 112 is a carbon dioxide laser for irradiating the light sensitive glass substrate 102 including a portion serving as the bonding interface between the Si substrate 101 and the light sensitive substrate 102.

In the above constitution, the light shielding mask 104 is placed on the surface of the Si substrate 101 just above the groove 105 of the light sensitive glass substrate 102, after the Si substrate 101 and the light sensitive glass substrate 102 have been put in close contact face to face as shown in FIG. 6. Further, the light sensitive glass 102 is aligned so that the platen 106 has no electrical connection except for the thin film electrode 103. A voltage is applied through the needle electrode 107 and the platen 106 between the Si substrate 101 and the thin film electrode 103 by the power source 108. By the application of the voltage, the electric field is maximum at thinned end portions of the light sensitive glass substrate 102. Only the thinned end portions and their adjacent portions are irradiated. Accordingly, the bonding between the Si substrate 101 and the light sensitive glass substrate 102 can be easily performed only at those portions where the electric field is maximum and the light enters. That is, partial selective bonding between the Si substrate 101 and the light sensitive glass substrate 102 is possible.

In this embodiment, a (100)-plane was a surface of the Si substrate, and the formation of thinned portion at both ends thereof was performed in the same method as described in the fifth embodiment. The formation of the groove 105 of the light sensitive glass substrate 102 and the thin film electrode 103 was performed in the same process as in the fifth embodiment.

Bonding conditions in this embodiment are as follows.
Size of Si (100) substrate:
26 mm×38 mm×0.5 mm (thickness) with sheet thickness of thinned portion at both ends: 0.3 mm
Size of light sensitive glass substrate 102:
30 mm×42 mm×1.0 mm (thickness)
(PEG glass made by HOYA Corporation) with size of groove 105:
30 mm×22 mm×0.5 mm (depth) with sheet thickness of thinned portion at both ends: 0.5 mm
Applied voltage: 400 V
Laser beam: Carbon dioxide laser ($\cong 5$ W/cm$^2$
Time: ten minutes per spot
Mask: Al plate
Area per spot of laser beam: $\cong 1$ cm$^2$ After this bonding experiment, a bonded sample was cut with a disc cutter, but there was no peeling at the bonding interface. That is, it has been proven that this bonding method can be put to practical use.

Note that when the thin film electrode 103 was formed of an Indium Tin Oxide (ITO) film, a carbon film, an Al film, an Au film, or a Pt film, the bonding strength equivalent to that mentioned above could be obtained. A bonded sample was cut with a disc cutter, but there was no peeling at the bonding interface.

As above described, with the anodic bonding using light irradiation, the bonding between the light sensitive glass and the electric conductor which have different thermal expansion coefficients can be easily made because of the capability of bonding at relatively low temperatures. Further, when the bonding between the Si substrate and the light sensitive glass is made in a vacuum atmosphere, a laser beam emitted from the laser oscillator is led through a lens or mirror into the vacuum atmosphere to irradiate the bonding portion, so that the bonding can be made without heating by a heater. Further the bonding between the Si substrate and the light sensitive glass substrate at a bonding portion like an opening of mask is also possible by using a mask for shielding the laser beam. That is, partial selective bonding is possible.

Figure 7:
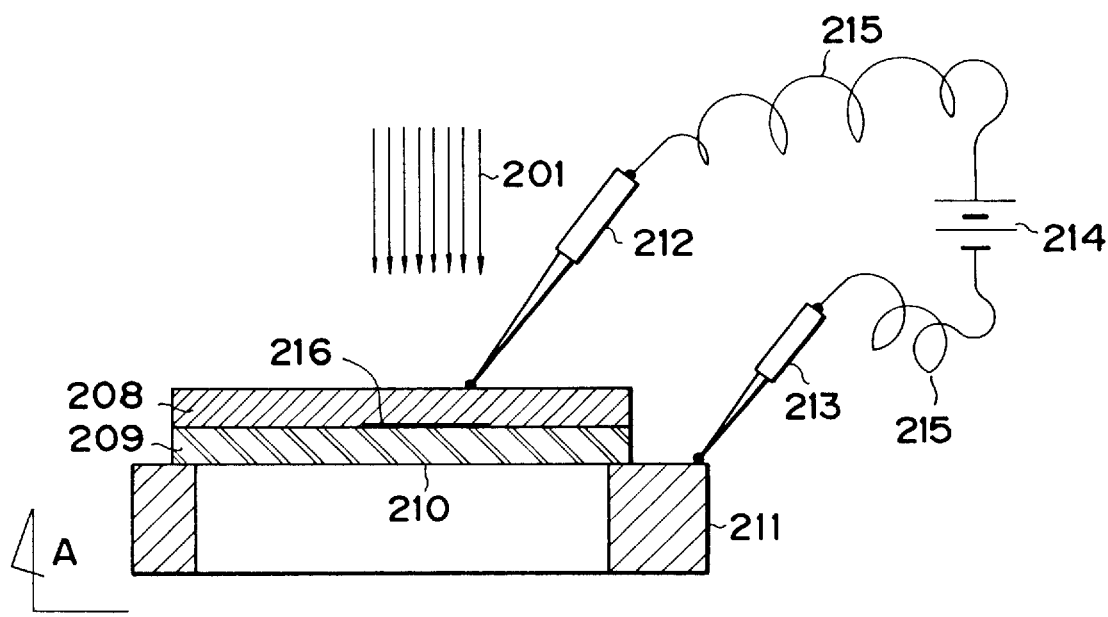
FIG. 7 is a schematic view of the anodic bonding with light irradiation in an eighth embodiment of the present invention.
Figure 8:
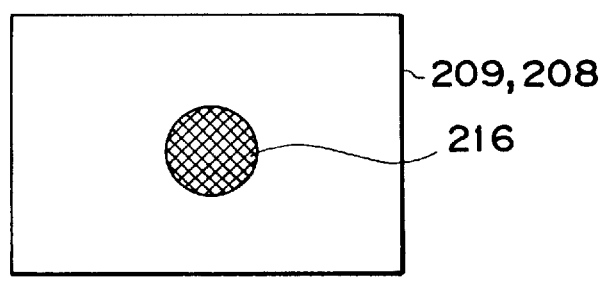
FIG. 8 is a view as seen from the direction arrow A in FIG. 7.
Figure 9:
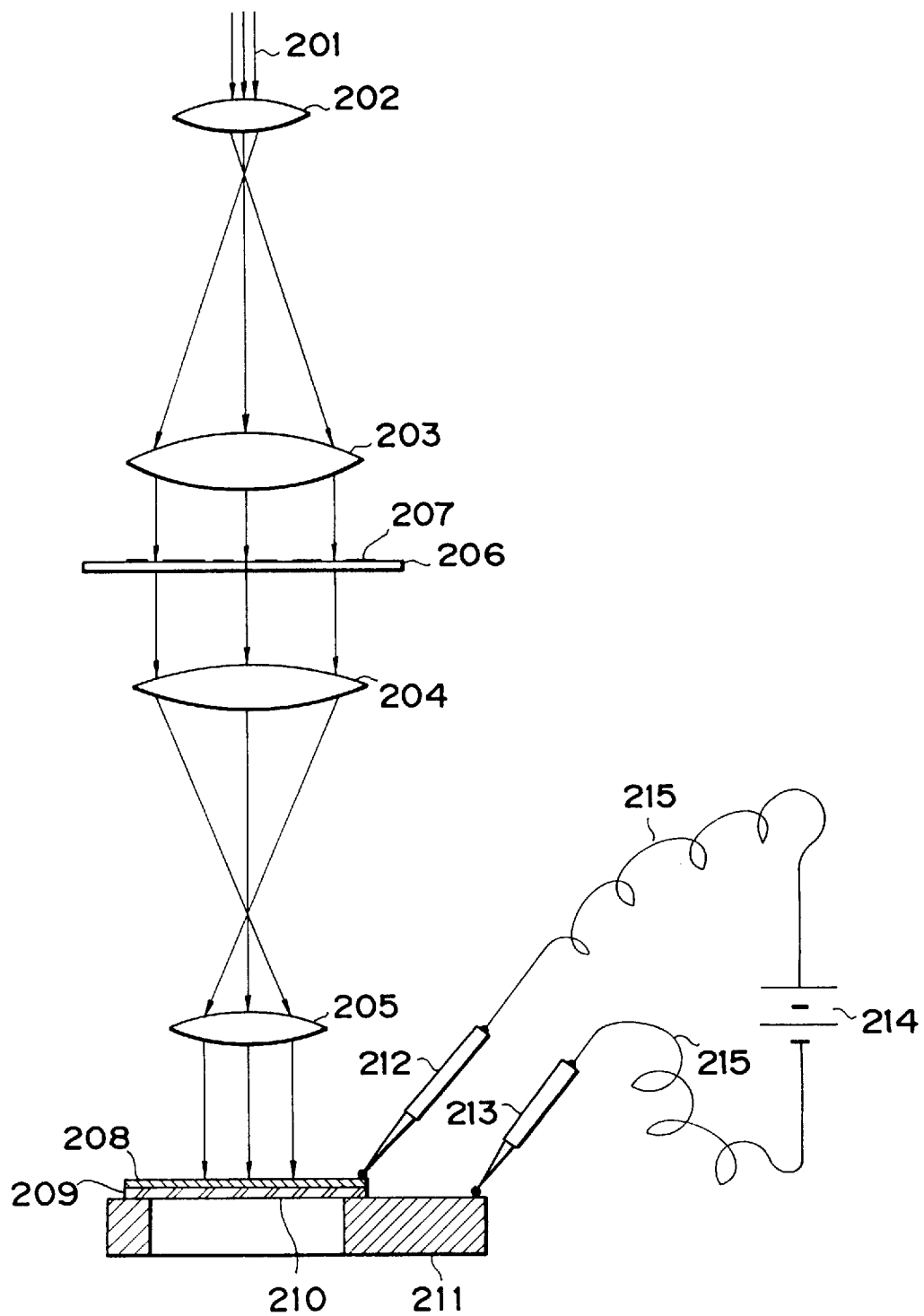
FIG. 9 is a schematic view of a laser optical system with mask allowing the use of the anodic bonding with light irradiation according to the present invention.

FIGS. 7, 8 and 9 are views for explaining a further embodiment of the present invention. These drawings are views best depicting the features of this embodiment, in which reference numeral 201 is a laser beam, 208 is an Si substrate, 209 is a glass (PYREX glass) substrate for bonding with the Si substrate 208, 210 is an electric conductive film composed of an ITO film formed on the surface of the glass substrate 209, 211 is a platen composed of an electric conductor for laying thereon the Si substrate 208 and the glass substrate 209 which are connected with each other, 212, 213 are needle electrodes electrically connecting to electric conductive films 210 on the surfaces of the Si substrate 208 and the glass substrate 209, respectively, 213 is a needle electrode electrically connecting to the platen 211, 214 is a DC power source for applying an electric field between the Si substrate 208 and the glass substrate 209, 215 is a lead wire for electrical connection between the needle electrode 212 and the DC power source 214 and between the needle electrode 213 and the DC power source 214, and 216 is a bonding portion between the Si substrate 208 and the glass substrate 209.

In the above constitution, the Si substrate 208 was placed on the glass substrate 209, then a laser beam 201 was irradiated from the side of the Si substrate 208, while at the same time a voltage was applied between the Si substrate 208 and the glass substrate 209 by the power source 214 for about ten minutes. As a result, a bonding area 216 corresponding to an irradiation region of the laser beam 201 could be observed between the Si substrate 208 and the glass substrate 209.

Note that in this embodiment the glass and the laser beam used are as follows.

Glass: PYREX glass 0.5 mm thick
Thickness of Si substrate: 0.5 mm
Laser: $CO_2$ laser beam 6 $W/cm^2$ In this way, when infrared light is used, it is efficient to direct radiation from the side of the Si substrate having a higher infrared transmittance.

On the other hand, in FIG. 7, when the bonding area is larger than a light flux area, the bonding can be performed over the entire bonding area by scanning the laser beam.

Further, it is possible to bond the Si film plane on a substrate having a Si film formed on the surface of an insulator such as glass or ceramics, instead of the Si substrate 208, with the glass substrate 209. That is, in this case, the Si film plane is electrically connected to the anode, and the electric conductive film 210 on the glass substrate 209 is electrically connected to the cathode. Thereafter, the laser beam is irradiated as a parallel flux from the glass substrate side to the bonding plane, while an electric field is being applied between the electrodes.

FIG. 9 is a constitutional view of an overall apparatus in this embodiment. Reference numeral 201 is a laser beam, 202, 203, 204 and 205 are lenses for enlarging and reducing the laser beam, and 206, 207 are a transparent glass to the laser beam 201 and a metallic film for reflecting the laser beam 201, which constitute a mask, respectively. Accordingly, the laser beam 201 can transmit through a portion where the metallic film 207 does not exist. 208 is a Si substrate for bonding, 209 is a glass substrate for bonding with the Si substrate 208, 210 is an electric conductive film composed of an ITO film formed on the surface of the glass substrate 209, 211 is a platen for laying thereon the Si substrate 208 and the glass substrate 209 which are connected with each other, 212 is a needle electrode electrically connecting to the surface of the Si substrate 208, 213 is a needle electrode electrically connecting to the platen 211, 214 is a DC power source for applying an electric field between the Si substrate 208 and the glass substrate 209, and 215 is a lead wire for electrical connection between the needle electrode 212 and the DC power source 214 and between the needle electrode 213 and the DC power source 214.

In the above constitution, the laser beam 201 is enlarged by the lens 202 and transformed into parallel rays by the lens 203, thereafter, the laser beam 201 passing through a pattern of the mask 207 is reduced by the lens 204 and further transformed into parallel rays by the lens 205, thereby irradiating a bonding portion between the Si substrate 208 and the glass substrate 209, while at the same time a voltage is applied between the Si substrate 208 and the glass substrate 209 by the DC power source 214. With the above optical system, it becomes possible to lead the laser beam 201 passing through the mask pattern 207 to a local bonding portion between the Si substrate 208 and the glass substrate 209. While in the optical system as shown in FIG. 9, a pattern projected onto the plane of a bonding sample (Si substrate 208/glass substrate 209) is a reversal pattern of the mask 207, it will be appreciated that it can be made a normal pattern of the mask 207 by adding a lens (not shown) to the optical system, without deviating from scope of the present invention. In this embodiment, the bonding between the Si substrate 208 having a plurality of concave grooves with a depth of 1000 Å formed thereon and the flat plate-like glass substrate 209 was made by the anodic bonding with light irradiation, using a predetermined mask 207 having a pattern for preventing irradiation on the grooves. As a result, it was found that the bonding was performed only on a partial plane except for the concave grooves.

Figure 10:
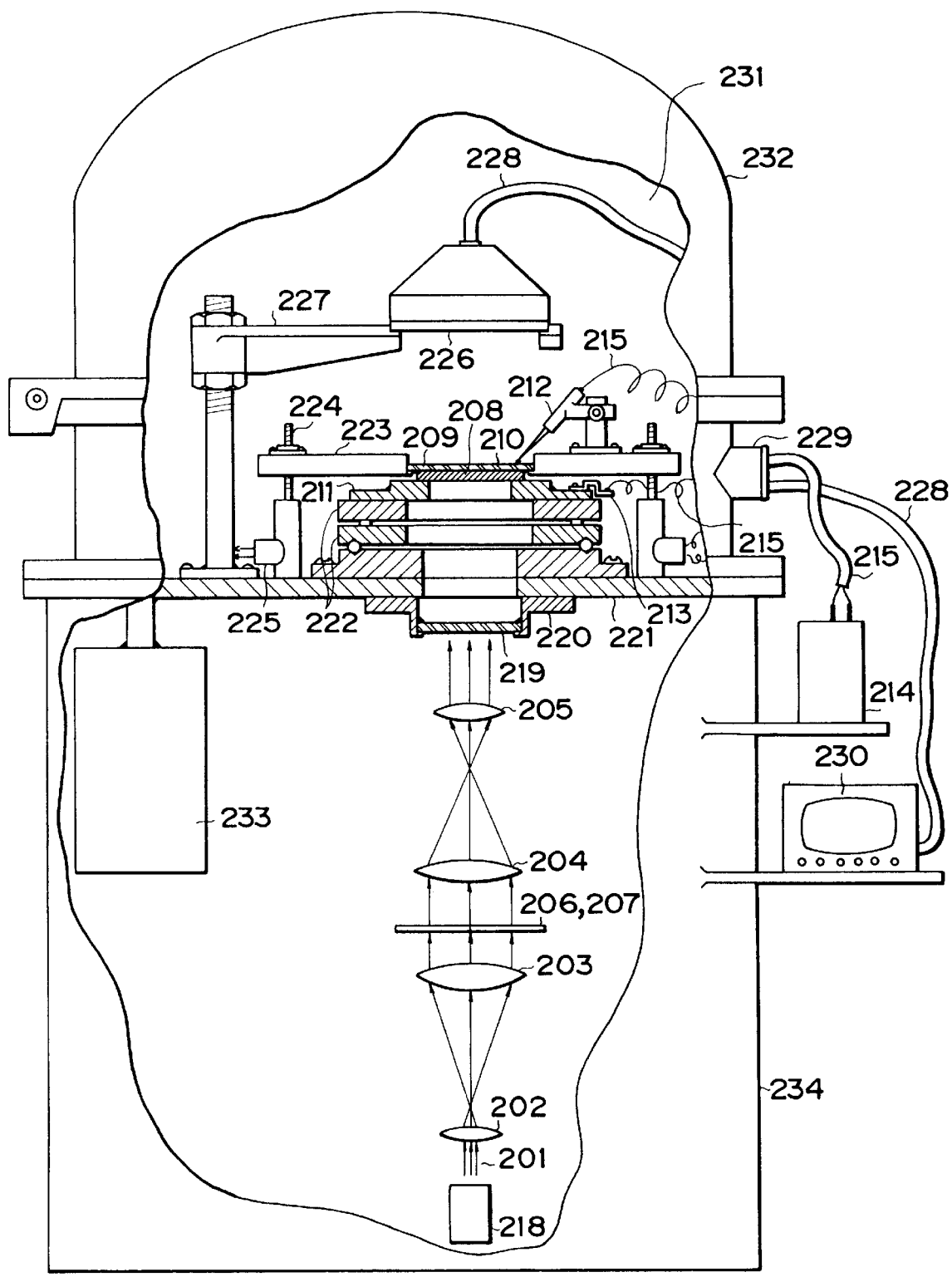
FIG. 10 is a schematic view of a bonding apparatus allowing the use of the anodic bonding with light irradiation according to the present invention.

FIG. 10 is a constitutional view of an apparatus in another embodiment of the present invention. Reference numeral 201 is a laser beam, 202, 203, 204 and 205 are lenses for enlarging and reducing the laser beam, and 206, 207 are a transparent glass to the laser beam 201 and a metallic film for reflecting the laser beam 201, respectively, which constitute a mask. Accordingly, the laser beam 201 can transmit through a portion where the metallic film 207 does not exist. 208 is a Si substrate for bonding, 209 is a glass substrate for bonding with the Si substrate 208, 210 is an electric conductive film composed of an ITO film formed on the surface of the glass substrate 209, 211 is a platen directly connected to a goniometer 222 for laying thereon the Si substrate 208, and the glass substrate 209 which are connected with each other, 212 is a needle electrode electrically connecting to an electric conductive film 210 on the surface of the glass substrate 209, 213 is an electrode electrically connecting to the platen 211, 214 is a DC power source for applying an electric field between the Si substrate 208 and the glass substrate 209, and 215 is a lead wire for electrical connection between the needle electrode 212 and the DC power source 214 and between the electrode 213 and the DC power source 214, 218 is a laser oscillator for oscillating the laser beam, 219 is a laser transmitting window for the vacuum sealing composed of a transparent glass to the laser beam 201, 220 is a laser transmitting window frame, 221 is a bottom plate of a vacuum apparatus connected to the laser transmitting window frame 220, 222 is an electrically driven goniometer (wiring not shown) movable in X-Y directions which is connected to the bottom plate 221 of the vacuum apparatus, 223 is a supporting plate for supporting the glass substrate 209, 224 is a rotary screw for moving the supporting plate 223 upward or downward, 225 is a motor (wiring not shown) for driving the supporting plate 223 upward or downward by rotating the rotary screw in a clockwise or counterclockwise direction, respectively, 226 is a light receiver for receiving the laser beam 201 transmitted through the Si substrate 208 and the glass substrate 209 which are connected, 227 is an arm for mounting the light receiver, 228 is a lead wire for the electrical connection from the light receiver 226 to a monitor television 230, 229 is a vacuum introducing electrode terminal for the electrical connection between a vacuum bath 231 and the atmosphere, 230 is a monitor television for viewing the information received by the light receiver 226, 231 is a vacuum bath for enabling the bonding between the Si substrate 208 and the glass substrate 209 in a vacuum, 232 is a bell jar for forming the vacuum bath and constructed detachably, 233 is a vacuum pump, and 234 is a skirted frame for supporting the vacuum bath 231 and accommodating a laser optical system as well as the vacuum pump 233.

The bonding principle of this apparatus is the same as shown in FIG. 9.

In the above constitution, the Si substrate 208 is placed on the platen 211, and the glass substrate 209 is placed on the supporting plate 223, thereafter, the operator makes an alignment between the Si substrate 208 and the glass substrate 209 by using the light receiver 226 switched to a visible light mode and the monitor 230 with the remote operation (operating means not shown) from the outside of the vacuum, as well as driving the goniometer 222, and then moves the supporting plate 223 downward by driving the motor 225 so as to bring the glass substrate 209 into slight contact with the Si substrate 208. Thereafter, the laser beam 201 passing through the optical system (composed of lenses 202, 203, 204, 205) is irradiated on the Si substrate 208 and the glass substrate 209, while a voltage is applied between the Si substrate 208 and the glass substrate 209 by the DC power source 214. During the bonding, it is possible to detect a bonding portion between the Si substrate 208 and the glass substrate 209 by observing visually the information from the light receiver 226 switched to a laser light mode on the monitor television.

With the provision of a mechanism (not shown) for moving the mask 206 forward and backward, leftward and rightward, it is possible to perform the bonding between the Si substrate 208 having a bonding portion which is similar to mask pattern, and the glass substrate 209. That is, it is possible to form a plurality of bonding portions having the same shape as the Si substrate or glass substrate by step and repeat.

While in the optical system as shown in FIG. 10, the pattern projected on to the bonding sample (Si substrate 208/glass substrate 209) is a reversal pattern of the mask 207, it will be appreciated that it can be made a normal pattern of the mask 207 by adding a lens (not shown) to the optical system, without deviating from scope of the present invention.

Figure 11:
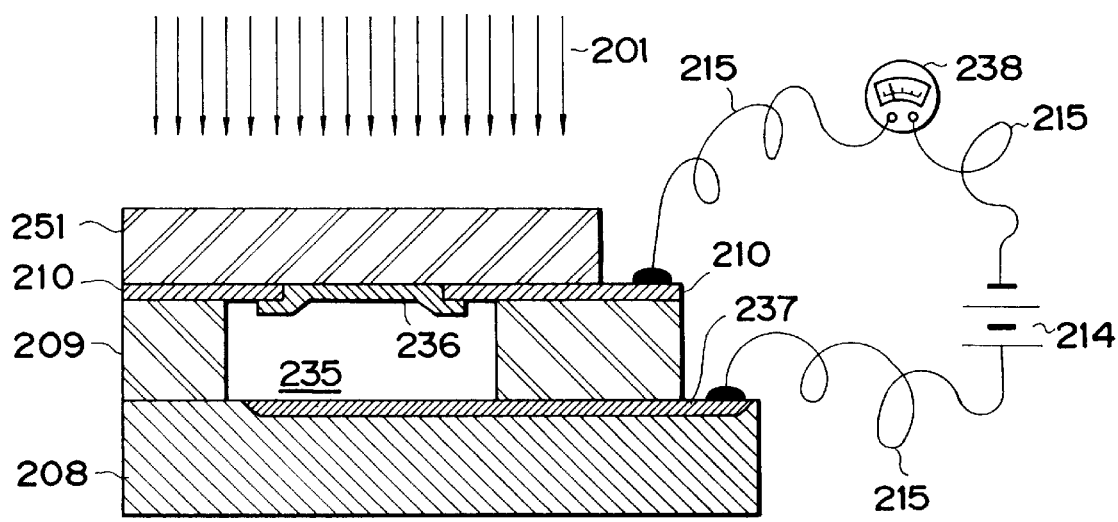
FIG. 11 is an explanation view of a light sensor chip capable of being produced by using the anodic bonding with light irradiation according to the present invention.

FIG. 11 is a view for explaining a light sensor chip produced by using the anodic bonding with light irradiation according to an embodiment of the present invention. Reference numeral 201 is a laser beam, 208 is a Si substrate, 209 is a glass substrate for bonding with the Si substrate 208, 210 is an electrically conductive film composed of Si thin film formed on the glass substrate 251, 214 is a DC power source for applying voltage between the electric conductive film 210 and an electrically conductive layer 237, 215 is a lead wire for electrical connection between the electric conductive film 210 and an ammeter 238, between the ammeter 238 and the DC power source 214, and between the DC power source 214 and the electric conductive layer 237, 235 is vacuum chamber formed by bonding between the Si substrate 208, the glass substrate 209 and the upper lid glass substrate 251, 236 is a photoelectric film for emitting electrons with the irradiation of laser beam 201, 237 is an electrically conductive layer which is electrically insulated from the Si substrate 208 and formed by the doping of impurities, 238 is an ammeter for detecting the electric current produced by electrons flying from the photoelectric film 236 to the electric conductive layer 237, and 251 is an upper cover glass for forming the vacuum chamber by being bonded via the electric conductive Si film to the glass substrate 209.

The chip of FIG. 11 is connected between the Si substrate 208 and the glass substrate 209, and between the glass substrate 209 and the Si thin film 210 on the upper cover glass 251, by the anodic bonding with light irradiation according to any one of the previous embodiments.

Figure 12:
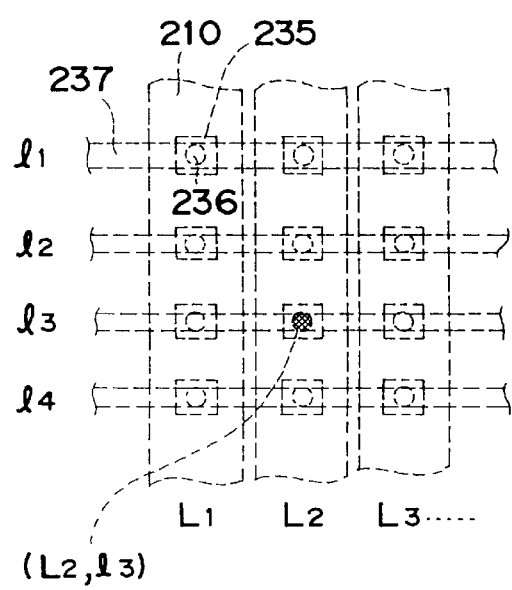
FIG. 12 is an explanation view from the top of a light sensor chip of FIG. 11.

Note that this light sensor chip takes a matrix configuration as shown in FIG. 12, wherein FIG. 11 is a cross-sectional view of only a portion at a position $(L_2, l_3)$ in FIG. 12. The ammeter 238 as well as its associated circuit are provided for each combination $(L_n, l_n)$ of electrically conductive film in longitudinal and transversal directions.

In the above constitution, when the laser beam 201 is irradiated on the photoelectric film 236, produced electrons fly toward the electrically conductive layer 237 which is an anode. At this time, the electric current will flow from the anode to the cathode. That is, the electric current will or will not flow depending on whether or not the laser beam 201 is irradiated on the photoelectric film 236. Accordingly, the laser irradiation at a position on the chip corresponding to each ammeter can be detected. When a visible light beam is irradiated instead of the laser beam 201, it can be constructed so that the electric current may flow as in the above embodiment by changing the material of photoelectric film 236 (e.g., multi alkali photoelectric plane).

In the case of producing an element composed of fine vacuum chambers capable of converting the light into an electric signal as above described, the anodic bonding with light irradiation according to the present invention, capable of working at the low temperature without causing thermal expansion, is effective. Chips can be fabricated excellently with less internal stress. While the glass used in this embodiment was PYREX glass, a light sensitive glass allows easier fabrication of the vacuum chambers.

Figure 13:
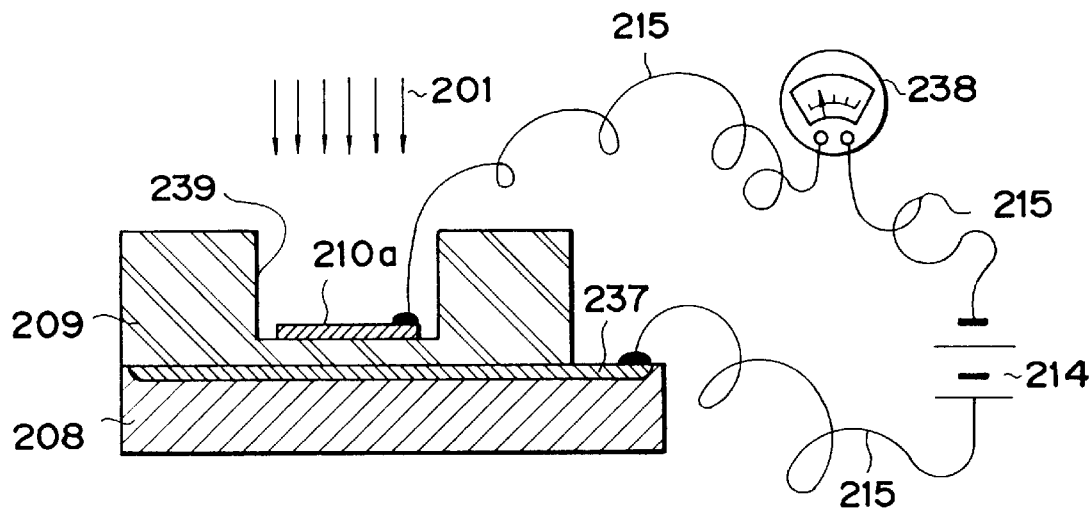
FIG. 13 is an explanation view of a light memory chip capable of being produced by using the anodic bonding with light irradiation according to the present invention.

FIG. 13 is a view for explaining a light memory chip produced by using the anodic bonding with light irradiation according to an embodiment of the present invention. Reference numeral 201 is a laser beam, 208 is a Si substrate, 209 is a glass substrate for bonding with the Si substrate 208, 210a is an electric conductive film (ITO film) formed in a groove 239 of the glass substrate 209, 214 is a DC power source for applying voltage between the electric conductive film 210a and an electric conductive layer 237, 215 is a lead wire for electrical connection between the electrically conductive film 210a and an ammeter 238, between the ammeter 238 and the DC power source 214, and between the DC power source 214 and the electrically conductive layer 237, 237 is an electrically conductive layer which is electrically insulated from the Si substrate 208 and formed by the doping of impurities, 238 is an ammeter, and 239 is a groove formed on the glass substrate 209.

Figure 14:
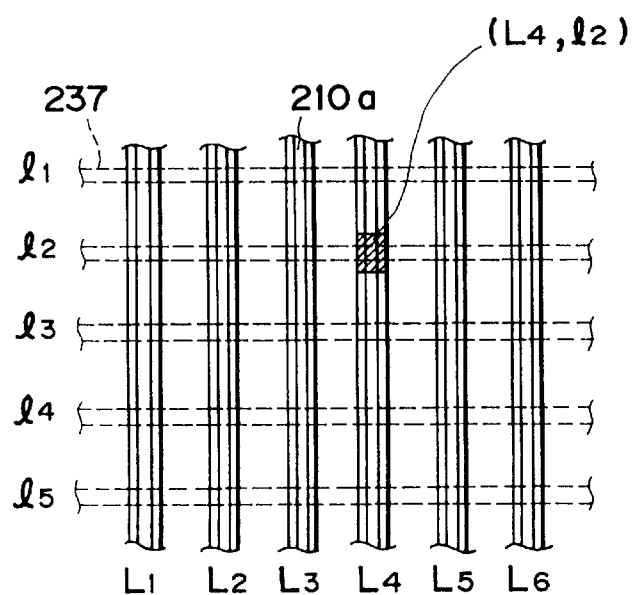
FIG. 14 is an explanation view from the top of the light sensor chip of FIG. 13.

The chip of FIG. 13 is bonded between the Si substrate 208 and the glass substrate 209 by the anodic bonding with light irradiation according to any one of the previous embodiments. This sensor chip also takes a matrix configuration as shown in FIG. 14, wherein FIG. 13 is a cross-sectional view of only a portion at a position $(L_4, l_2)$ in FIG. 14. The ammeter 238 as well as its associated circuit are provided for each combination $(L_n, l_n)$ of the electrically conductive film in longitudinal and transversal directions.

In the above constitution, when the laser beam 201 is irradiated on the groove 239, impurity ions composed of cations of the glass 209 are more likely to move toward the electric conductive film 210a which is a cathode. That is, ionic electric current will instantaneously flow from the anode to the cathode. Next, when the laser beam is once interrupted and the laser beam is then irradiated again toward the groove 239 as above described, the ionic electric current does not flow. Thus, in order to have the ionic electric current flow again, i.e., to refresh, when the laser beam 201 is irradiated on the groove 239 as above described, the polarity of the DC power source 214 must be changed while the laser beam is being irradiated.

In fabricating a micro device as above described which serves as a memory, the anodic bonding with light irradiation according to the present invention, which does not cause thermal expansion, is effective. Chips are fabricated excellently with less internal stress. Note that the glass used in this embodiment was PYREX glass.

The method of examining whether or not the light is irradiated on each matrix point, i.e., the reading of information, can be accomplished in the following way.

1. A voltage is applied to each matrix point while the light is irradiated on each matrix.
  (a) At this time, matrix point where ionic current has flowed means that light is not irradiated in advance, namely it is not memorized.
  (b) On the contrary, the matrix point where ionic current has hardly flowed means that light is irradiated in advance, namely, it is memorized.

2. Accordingly, it is possible to read the memory all over the matrix points when each matrix point is examined for electric conduction thereof by applying a voltage between electrodes constituting the matrix, i.e., between $L_m$–$l_n$ (m=1–M, n=1–N for a matrix of M×N) in a certain sequence.

3. When the memory is still stored after reading, the following operation is performed. That is only in matrix points not memorized, the polarity between electrodes constituting the matrix is reversed immediately after reading, while irradiation is continued. Through this operation, ions in the matrix point can be returned to their original position.

Figure 15:
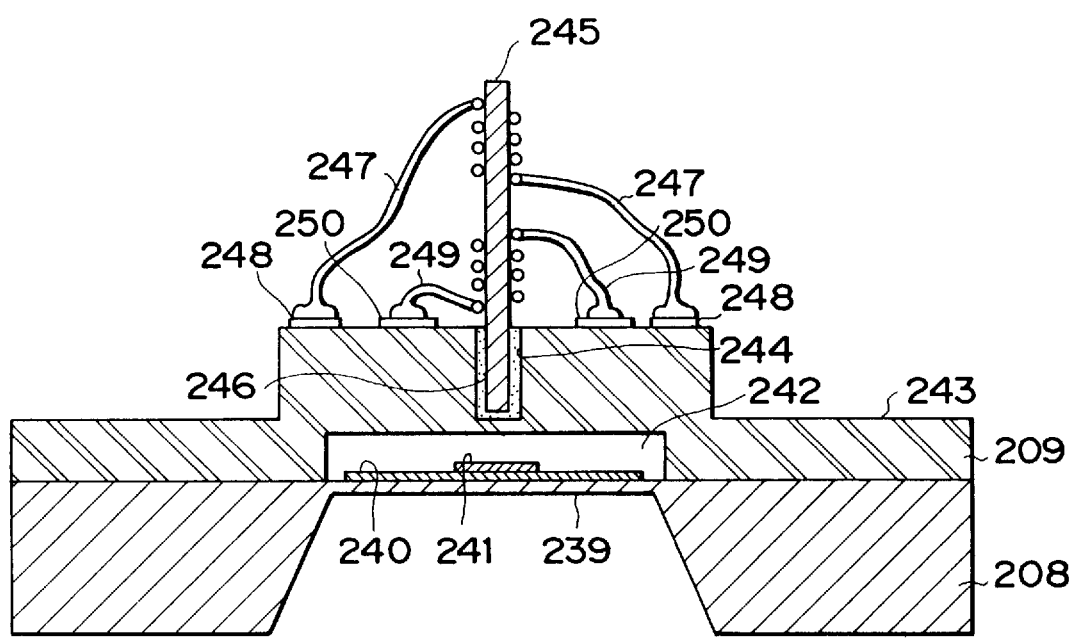
FIG. 15 is an explanation view of a pressure sensor capable of being produced by using the anodic bonding with light irradiation according to the present invention.

FIG. 15 is a view for explaining a pressure sensor produced by using the anodic bonding with light irradiation according to an embodiment of the present invention. Reference numeral 208 is a Si substrate, 209 is a glass substrate (light sensitive glass) for bonding with the Si substrate 208, 239 is a membrane fabricated on the Si substrate 208, 240 is an insulation film composed of a Si oxide film, 241 is a non-magnetic member made of a metal, i.e., an electric conductive film which is an electric conductor, 242 is an air-tight chamber fabricated in the glass substrate 209, 243 is a step portion fabricated in the glass substrate 209, 244 is a deep groove portion, 245 is a soft magnetic material (permalloy), 246 is a polymer adhesive for securing the soft magnetic material 245 to the deep groove portion 244, 247 is a primary coil for magnetizing the soft magnetic material 245, 248 is an input terminal for inputting external alternating current into the primary coil, 249 is a secondary coil for picking up a signal on a portion wound around the soft magnetic material 245, and 250 is an output terminal. The bonding between the Si substrate 208 and the glass substrate 209 is performed by using the anodic bonding with light irradiation according to any one of the previous embodiments.

Next, in the above constitution, when external pressure is applied on the membrane 239, the membrane 239 is warped inward or outward arcuately. That is, when external atmospheric pressure is higher than the pressure in the air-tight chamber 242, the membrane is warped inward, on contrary when atmospheric pressure is lower, the membrane is warped outward. At this time, the electric conductive film 241 moves closer to or away from the soft magnetic material 245, so that a change in eddy current occurs near the surface of the electric conductive film 241. The magnetic flux is changed by the change in eddy current, so that the electromotive force generated in the coil 249 is changed. It is possible to detect the external pressure by precalibrating the variation of electromotive force and the external pressure acting on the membrane 239. Further, when the air-tight chamber is fabricated at a known pressure, it is possible to determine the measured pressure with reference to such pressure of the air-tight chamber (however, in an environment where measured temperature changes, calibration must be made for the amount of change in the measured temperature). The anodic bonding with light irradiation according to the present invention, which does not cause thermal expansion, is effective in fabricating such a pressure sensor. A fabricated sensor allows suppression of the internal pressure and to perform more precise pressure sensing. Note that the glass used in this embodiment is a light sensitive glass substrate.

Note that in the above embodiments another material such as an electric conductor like Al, Ta, Ti, Ni, Ge, GaAs, or Cr alloy can be substituted for the Si substrate and another amorphous material can be substituted for the glass substrate. In these cases, to transmit the light to a bonded face, the light capable of transmitting through at least one of the materials may be irradiated from the side of that material, or by forming at least one of the materials to be thin sufficiently to transmit the light, the light may be irradiated from the side of that material.

What is claimed is:

1. A process for anodic bonding between an electric conductor and an amorphous insulator, comprising the steps of:

placing said electric conductor into contact with said amorphous insulator;

applying a voltage between said contacted electric conductor and amorphous insulator; and irradiating a light flux through an illumination optical system toward a contact portion between said contacted electric conductor and amorphous insulator; and providing a mask during said irradiating step for masking said contacted electric conductor and amorphous insulator to prevent the irradiation of said light flux on the contacted electric conductor and the amorphous insulator except for an area of the contact portion between said electric conductor and said amorphous insulator where anodic bonding will occur in said irradiating step, wherein said irradiating onto said area of the contact portion, amorphous insulator and electric conductor is performed by irradiating said mask.

2. A process according to claim 1, wherein the irradiating light flux in said irradiating step is a light beam having a wavelength for exciting ions in a network structure of said amorphous insulator.

3. A process according to claim 1, wherein the irradiating light flux in said irradiating step is an infrared light having a wavelength in the range of 1.0 to 12 $\mu$m.

4. A process according to claim 1, wherein the irradiating light flux in said irradiating step is a light beam having a wavelength for acting to cut a connection in a network structure of said amorphous insulator.

5. A process according to claim 1, wherein the irradiating light flux in said irradiating step is an ultraviolet light having a wavelength in the range of 0.2 to 0.45 $\mu$m.

6. A process according to claim 1, wherein the irradiating light flux in said irradiating step is an ultraviolet light and an infrared light which are irradiated simultaneously.

7. A process according to claim 6, wherein said amorphous insulator includes modifier ions, said ultraviolet light in said irradiating step relaxes a network structure of said amorphous insulator by cutting binding portions in said network structure of said amorphous insulator and promoting diffusion of the modifier ions within said amorphous insulator while said infrared light relaxes said network structure by exciting ions in said network structure of said amorphous insulator with oscillation.

8. A process according to claim 1, wherein said electric conductor comprises Si.

9. A process according to claim 1, wherein said amorphous insulator comprises a heat-resistant glass.

10. A process according to claim 1, wherein said amorphous insulator comprises a soda-silicate glass.

11. A process according to claim 1, wherein said amorphous insulator comprises a light sensitive glass.

12. A process for anodic bonding between an electric conductor and an amorphous insulator, comprising the steps of:

placing said electric conductor into contact with said amorphous insulator;

applying a voltage between said contacted electric conductor and amorphous insulator; and irradiating a light flux through an illumination optical system toward a contact portion between said contacted electric conductor and amorphous insulator, wherein an image of a predetermined pattern is projected on said contact portion, electric conductor and amorphous insulator by the illumination optical system in said irradiating step so that the irradiation of the light flux is prevented except for an area of a contact portion to be anodic bonded between said electric conductor and said amorphous insulator to be anodic bonded.

13. A process for anodic bonding between an electric conductor and an amorphous insulator, comprising the steps of:

placing the electric conductor into contact with a first side of the amorphous insulator;

arranging a voltage application thin film electrode on a second side of the amorphous insulator, the second side facing the first side, the voltage application thin film electrode being only arranged over all of an area of the second side facing a portion of the first side to be anodically bonded to the electric conductor; and irradiating a light flux through an illumination optical system toward a contact portion between the contacted electric conductor and amorphous insulator to anodically bond the electric conductor and the amorphous insulator.

14. A process for anodic bonding between a semiconductor and a glass including a modifier ion which becomes capable of being moved by light irradiation, comprising the steps of:

placing the semiconductor into contact with the glass;

applying a voltage between the contacted semiconductor and glass; and irradiating a light flux through a partially illuminating optical system toward a contact portion between the contacted semiconductor and glass, wherein the light flux is irradiated only to areas of the contact portion to be anodically bonded between the semiconductor and the glass and irradiation of the light flux to areas not to be anodically bonded is prevented.

* * * * *

UNITED STATES PATENT AND TRADEMARK OFFICE
CERTIFICATE OF CORRECTION

PATENT NO. : 5,820,648

DATED : October 13, 1998

INVENTOR(S) : MASATAKE AKAIKE, ET AL.                Page 1 of 3

It is certified that error appears in the above-identified patent and that said Letters Patent is hereby corrected as shown below:

At [57]  ABSTRACT

Line 1, "which" should read --which a-- and "and" should read --and a--.

COLUMN 1

Line 39, "to" should read --to the--;

COLUMN 2

Line 67, "can" should read --which can--.

COLUMN 3

Line 31, "exciting bonded ion" should read --exciting bonded ions--.

COLUMN 4

Line 25, "code" should read --cord--.

COLUMN 5

Line 13, "in" should read --in a--.

COLUMN 6

Line 3, "modifier" should read --a modifier--.

UNITED STATES PATENT AND TRADEMARK OFFICE
CERTIFICATE OF CORRECTION

PATENT NO. : 5,820,648
DATED : October 13, 1998
INVENTOR(S) : MASATAKE AKAIKE, ET AL.

It is certified that error appears in the above-identified patent and that said Letters Patent is hereby corrected as shown below:

COLUMN 7

Line 32, "platen," should read --the platen,--;
Line 42, "is" should read --are in--; and
Line 64, "applied," should read --applied--.

COLUMN 8

Line 15, "( 1.5 W/cm$^2$)" should read --($\cong$1.5 W/cm$^2$)--.

COLUMN 10

Line 15, "of" should read --of a--; and
Line 33, "($\cong$5 W/cm$^2$" should read --($\cong$5 W/cm$^2$)--.

COLUMN 13

Line 35, "mask" should read --the mask--;
Line 44, "scope" should read --the scope--; and
Line 59, "vacuum" should read --a vacuum--.

COLUMN 14

Line 27, "multi alkali" should read --multi-alkali--.

COLUMN 15

Line 20, "matrix" should read --a matrix--.

UNITED STATES PATENT AND TRADEMARK OFFICE
CERTIFICATE OF CORRECTION

PATENT NO. : 5,820,648
DATED : October 13, 1998
INVENTOR(S) : MASATAKE AKAIKE, ET AL.

It is certified that error appears in the above-identified patent and that said Letters Patent is hereby corrected as shown below:

COLUMN 16

Line 25, "thin sufficiently" should read --sufficiently thin--.

Signed and Sealed this

Twenty-seventh Day of July, 1999

Attest:

Q. TODD DICKINSON

Attesting Officer

Acting Commissioner of Patents and Trademarks